United States Patent [19]

Holleran et al.

[11] Patent Number: 4,897,509

[45] Date of Patent: Jan. 30, 1990

[54] GLASS-CERAMICS FOR ELECTRONIC PACKAGING

[75] Inventors: Louis M. Holleran, Big Flats; John F. MacDowell; Francis W. Martin, both of Painted Post, all of N.Y.

[73] Assignee: Corning Incorporated, Corning, N.Y.

[21] Appl. No.: 238,574

[22] Filed: Aug. 31, 1988

Related U.S. Application Data

[63] Continuation of Ser. No. 42,980, Apr. 27, 1987, abandoned.

[51] Int. Cl.$^4$ ............................................... H05K 1/03
[52] U.S. Cl. .................................... 174/258; 428/137; 428/209; 428/210; 428/426; 428/432; 428/901; 501/9; 501/61; 501/62; 501/67; 501/69; 361/414
[58] Field of Search ............... 174/68.5; 428/137, 209, 428/210, 426, 432, 901; 501/9, 61, 62, 67, 69; 361/414

[56] References Cited

U.S. PATENT DOCUMENTS

| | | | |
|---|---|---|---|
| 3,275,493 | 9/1966 | MacDowell | 501/9 |
| 3,450,546 | 6/1969 | Stong | 501/9 |
| 3,926,648 | 12/1975 | Miller | 501/9 |
| 3,967,971 | 7/1976 | Eppler | 501/9 |
| 4,413,061 | 11/1983 | Kumar et al. | 501/7 |
| 4,540,671 | 9/1985 | Kondo et al. | 501/9 |
| 4,588,699 | 5/1986 | Brennan et al. | 501/9 |

FOREIGN PATENT DOCUMENTS 1535202  12/1978  United Kingdom .................. 501/9

*Primary Examiner*—Mark L. Bell
*Attorney, Agent, or Firm*—Clinton S. Janes, Jr.

[57] ABSTRACT

This invention relates to the production of glass-ceramic materials particularly suitable for use as substrates in integrated circuit packaging. The inventive glass-ceramics can be prepared from thermally crystallizable glass capable of being concurrently sintered and crystallized in situ at temperatures between about 850°–1000° C. to bodies exhibiting dielectric constants less than about 6, linear coefficients of thermal expansion between about $12-60\times10^{-7}$/°C. and containing cordierite solid solution as essentially the sole crystal phase. The glass-ceramics are essentially free from $Li_2O$ and $Na_2O$ and consist essentially, expressed in terms of weight percent on the oxide basis of 10–25% $MgO+ZnO$ consisting of 2–18% $MgO+0-21\%$ $ZnO$, 20–38% $Al_2O_3$, 40–52% $SiO_2$, and 2–15% total of at least one oxide in the indicated proportion selected from the group consisting of up to 8% of an alkali metal oxide selected from the group consisting of $K_2O$, $Rb_2O$, and $Cs_2O$, up to 10% of a divalent metal oxide selected from the group consisting of CaO, SrO, BaO, and PbO, and up to 5% $B_2O_3$.

2 Claims, No Drawings

GLASS-CERAMICS FOR ELECTRONIC PACKAGING

This is a continuation of application Ser. No. 42,980, filed Apr. 27, 1987 abandoned.

BACKGROUND OF THE INVENTION

The heart of an active electronic device is the transistor. Real progress in electronics has been paced by improvements in this basic device and the ability to pack more and more of them onto a single silicon or gallium arsenide wafer. In order for those active devices (or integrated circuits) to perform, they must be electrically connected to other devices. The devices must also be protected from the surrounding environment, from physical abuse, and from overheating. These necessary connections and protections are best provided by encasing the active devices within a hermetic package.

The rapid advance of integrated circuit technology in the past decade has not been matched by similar improvements in needed packaging capability. Thus, the lag in technology required to properly package the active device has actually limited the use of the device.

The largest volume of today's integrated circuits is contained in plastic packaging. In those applications where high reliability and long life have been demanded, packaging systems consisting predominantly of $Al_2O_3$ and $Al_2O_3$/glass mixtures have customarily been used. Several drawbacks have been experienced in the use of packages containing $Al_2O_3$, however, as will be explained below.

As the integrated circuit device becomes more complex, i.e., comprising more active elements, a higher proportion of the system signal response time is required to transmit signals between chips, to other integrated circuit devices, etc. Packaging high speed devices demands close control of noise, impedance, resistivity, and temperature rise.

Improved interconnect signal speed and integrity can be achieved by shortening the signal path between chips, by improved ceramic electrical properties, viz., lower dielectric constant and lower dissipation factor, by reducing the resistance of the signal conductor, and by the reduction of noise. The closer spacing of chips requires very fine and closely spaced signal lines and multi-layer packages with fine internal connections (vias). Surface smoothness and flatness, together with dimensional control, become critical for fine line metallization and via registration.

Whereas $Al_2O_3$ can be ground to a smooth finish, the high shrinkage thereof ($\approx 18\%$) and difficulty in machining present problems for high density via registration. The high dielectric constant of $Al_2O_3$ ( 10) restricts line spacing (development of cross talk and noise) and also slows the signal itself. A major drawback witnessed in the use of $Al_2O_3$ packaging resides in the need for utilizing high temperature metals such as molybdenum or tungsten because of the very high co-firing temperature required for sintering ($\geq 1500°$ C. While the resistivities of those metals are relatively low, they are significantly higher than those of silver, copper, and gold and, of course, necessitate gold plating prior to soldering.

Therefore, the objective of the present invention was to develop a dielectric material for use in packaging active electronic devices exhibiting properties constituting a significant improvement over $Al_2O_3$. The goal of the research was, therefore, to develop a material demonstrating the following characteristics: (1) compatibility with copper, silver, and gold metallization; (2) the capability of being co-fired at temperatures between about 850°–1000° C.; (3) a dielectric constant less than about 6; (4) a smooth, flat surface without additional processing; and (5) preferably a coefficient of thermal expansion compatible with silicon ($\approx 35 \times 10^{-7}/°$C.) or gallium arsenide ($\approx 60 \times 10^{-7}/°$C.).

The present invention resulted from research directed to developing surface-nucleated glass-ceramic frits as replacements for $Al_2O_3$. That research focussed primarily in the fabrication of multi-layer packages by processing glass-ceramic frits into thin dielectric sheets through tape casting.

Glass-ceramics had their genesis in U.S. Pat. No. 2,920,971. As explained there, glass-ceramics are conventionally prepared through the controlled crystallization of precursor glass bodies through three general steps: (1) a glass forming batch, commonly containing a nucleating agent, is melted; (2) that melt is cooled below the transformation range thereof and simultaneously shaped into a glass body of a desired geometry; and (3) that glass body is subjected to a predetermined heat treatment to cause the generation of crystals in situ. Frequently, the heat treatment of the glass body is applied in two stages; viz., the body is initially heated to a temperature within or slightly above the transformation range to cause the development of nuclei therein, and, subsequently, the nucleated body is heated to a temperature approaching or even exceeding the softening point of the glass to grow crystals on the nuclei. (The transformation range has been defined as the temperature at which a molten mass is deemed to have become an amorphous solid; that temperature being generally considered as residing in the vicinity of the glass annealing point.)

The rate of crystal growth is a function of temperature; i.e., crystal development becomes more rapid as the temperature is raised. This circumstance permits a degree of control over the concentration of crystallization in the final product. Customarily, the precursor glass body is heat treated sufficiently to yield highly crystalline articles, i.e., greater than 50% by volume crystalline and, frequently, closely approaching 100%. The normally high crystallinity of glass-ceramics, i.e., greater than 50% by volume crystalline and, frequently, closely approaching 100%, leads to two results: (1) the physical properties displayed by glass-ceramics more nearly resemble those of the crystal phase than those of the residual glass; and (2) the composition of the residual glass is quite unlike that of the parent glass, since the components of the crystal phase will have been removed therefrom; so, consequently, the physical properties demonstrated by the residual glass will be different from those of the precursor glass. Finally, because the crystals of a glass-ceramic are encompassed within a residual glassy matrix, the surface of a glass-ceramic body is smooth and the interior portion thereof non-porous and free of voids.

Whereas most glass-ceramic articles have been prepared from precursor glass compositions containing a component specifically designed to perform as a nucleating agent, glass-ceramic bodies have been successfully produced by utilizing surface nucleation in the sintering together and consolidating of very fine glass powders. Such bodies can exhibit the contours and physical properties demonstrated by glass-ceramics prepared in the more conventional process.

SUMMARY OF THE INVENTION

We have found dielectric materials exhibiting properties superior to those of $Al_2O_3$ with respect to ease of fabrication and use in packaging for active electronic devices. The materials can be processed into flat sheets, metallized, laminated, and sintered at temperatures below 1000° C. (to enable high performance metallization). Our research has focussed particularly on processing surface-nucleated, thermally-crystallizable frits through tape casting into thin dielectric sheets, the compositions of those frits comprising modifications of the basic cordierite composition.

Stoichiometric cordierite ($2MgO \cdot 2Al_2O_3 \cdot 5SiO_2$) frit must be fired at temperatures above 1350° C. to obtain a well-sintered cordierite structure. Even when fired for 30 minutes at 1450° C., a completely non-porous body was not achieved. By properly modifying the base composition, however, well-sintered, non-porous glass-ceramic bodies can be produced at sintering temperatures below 1000° C., which bodies have lower coefficients of thermal expansion and lower dielectric constants than $Al_2O_3$. To illustrate:

U.S. Pat. No. 4,015,048 elucidates the principle of cation stuffing into the large cavities of the cordierite crystal structure with complementary changes in $Al_2O_3$ and $SiO_2$ concentrations to maintain charge balance. As is explained in that patent, when powdered glass having the 2:2:5 stoichiometry of cordierite (approximate weight percent 13.7% MgO, 34.9% $Al_2O_3$, 51.4% $SiO_2$) is heated to elevated temperatures, a $\beta$-quartz solid solution phase forms before sintering together of the glass particles is complete, which action severely limits the degree of consolidation achieved. Upon further heating, the $\beta$-quartz phase is converted into cordierite, but with essentially no improvement in consolidation. That situation can be ameliorated through the substitution of $M^+ + Al^+$ for $Si^{+4}$, where $M^+$ is a large alkali metal ion selected from the group of $K^+$, $Rb^+$, and $Cs^+$. The large alkali metal ion occupies a cavity in the crystal structure bounded by silica-oxygen rings. (The silica-oxygen rings, two per unit cell, initially contain 10 $Si^{+4}$ and $2Al^{+3}$). With the addition of the alkali metal ion, an $Al^{+3}$ ion replaces a $Si^{+4}$ ion in the ring. Divalent cations may also be used; the substitution being $\frac{1}{2}M^{+2}$ $Al^{+3}$ for $Si^{+4}$. Operable divalent cations include $Ca^{+2}$, $Sr^{+2}$, $Ba^{+2}$, and $Pb^{+2}$.

In general, our laboratory work has demonstrated that the greater the quantity of alkali metal or divalent metal oxide added to the base cordierite stoichiometry, the greater the level of glass particle sintering before the onset of crystallization. Where alkali metals are the substituting ions, additions thereof can be incorporated to such an extent that both large cavities in the cordierite cell are occupied. Such additions, however, demand high melting temperatures due to the large $Al_2O_3$ content of the glass batch. Where divalent cations comprise the substitution, the limit of such additions is about $\frac{1}{2}M^{+2}$ per unit cell, which corresponds to only $\frac{1}{4}$ occupancy of the large cavities. Additions beyond that limit result in crystal phases other than cordierite being formed.

Another substitution of cations, which our work has indicated to be advantageous in increasing the degree of glass particle sintering before crystallization, involves $Mg^{+2} + Si^{+4}$ for $2Al^{+3}$. This substitution does not entail an additional cation, as is required in the above-described reaction, since charge balance is preserved. The full extent to which this substitution can be carried out has not been finally proven, but is believed to be about $\frac{3}{4}$ ions per unit cell. In this substitution a $Mg^{+2}$ ion is presumed to replace an $Al^{+3}$ ion in a tetrahedral site in the crystal framework. (The other $Mg^{+2}$ ions occupy octahedral sites.) A $Si^{+4}$ ion replaces an $Al^{+3}$ ion in the ring structure.

The increase in sintering prior to crystallization is obtained because the higher MgO content leads to a departure from the stoichiometry of $\beta$-quartz ($MgO \cdot Al_2O_3 \cdot nSiO_2$). Nevertheless, whereas the greater MgO levels promote sintering at lower temperatures by repressing the early crystallization of $\beta$-quartz, the initial crystal phase developed is still $\beta$-quartz solid solution. We have found that the combination of excess MgO and large cation stuffing provides improved sintering of glass particles before crystallization for a given amount of cation addition. The addition of MgO also reduces the softening point of the glass and, together with the greater amount of large cation stuffing permitted, can lead to a higher coefficient of thermal expansion in the resultant glass-ceramic.

Still another substitution which our work has shown to be advantageous involves $Zn^{+2} + Si^{+4}$ for $2Al^{+3}$. Inasmuch as the zinc ion much prefers a tetrahedral coordination over an octahedral coordination, a $Zn^{+2}$ ion, rather than will replace a tetrahedral $Al^{+3}$ ion in the framework structure. Because of its preference for tetrahedral coordination, it is believed that a greater quantity of $Zn^{+2}$ ions can be substituted in this reaction than ions. The substitution of $Zn^{+2}$ ions has the further advantage of producing a softer glass phase that can subsequently be sintered together (consolidated) and crystallized at lower temperatures.

Finally, yet another substitution which our work has demonstrated can secure improved sintering together of the glass particles before the inception of crystallization, and permits sintering to be conducted at lower temperatures, contemplates the replacement of $Al_2O_3$ with $B_2O_3$. This substitution is severely restricted, however, the limit corresponding to replacing only $\frac{1}{2}Al^{+3}$ with the $\frac{1}{2}B^{+3}$ per unit cell. It is assumed that a $B^{+3}$ ion replaces an $Al^{+3}$ ion in the ring position. Although the concentrations of $B_2O_3$ that can be utilized are quite limited, the presence of $B^{+3}$ ions seems to repress the formation of $\beta$-quartz solid solution to a much greater extent than the formation of cordierite.

We have found that, by combining the above substitutions in various ways, compositions can be tailored to demonstrate optimum sintering in the glassy phase and to crystallize in situ to cordierite with essentially no discernible $\beta$-quartz phase at lower temperatures than would otherwise be possible. The inclusion of ZnO promotes exceptional behavior in that regard. For example, the addition of ZnO permits cordierite glasses to be obtained which sinter and crystallize in situ after brief exposures at relatively low temperatures. Hence, a short heat treatment, which is highly desirable for sintering thick film circuitry in integrated circuit devices is made possible. We have developed ZnO-containing glasses capable of being fully consolidated where the maximum temperature is only about 940° C. and the period of exposure is only about 15 minutes.

In summary, the above substitution reactions enable products to be produced wherein the properties exhibited thereby can be tailored over a wide range of values.

Hence, frits of the inventive compositions can be sintered together at temperatures between about 850°–1000° C. to form integral, non-porous glass-ceramic bodies demonstrating smooth flat surfaces, dielectric constants less than 6, and linear coefficients of thermal expansion compatible with those of silicon and gallium arsenide, i.e., higher than $12 \times 10^{-7}/°C$. and up to about $60 \times 10^{-7}/°C$., wherein a cordierite solid solution constitutes essentially the sole crystal phase.

Expressed in terms of weight percent on the oxide basis, the inventive compositions consist essentially of 10–25% MgO+ZnO, consisting of 2–18% MgO+0–21% ZnO (preferably >16–25% MgO+ZnO), 20–38% $Al_2O_3$ (preferably 20–35% $Al_2O_3$), 40–52% $SiO_2$, and 2–15% total of at least one oxide in the indicated proportion selected from the group consisting of up to 8% $K_2O$ and/or $Rb_2O$ and/or $Cs_2O$, up to 10% CaO and/or SrO and/or BaO (preferably 0–5% BaO) and/or PbO, and up to 5% $B_2O_3$. Where desired, up to 1% $As_2O_3$ and/or $Sb_2O_3$ may be included in their customary role as a fining agent.

Although the presence of $Li_2O$ and/or $Na_2O$ will also reduce the sintering temperature of the inventive frits, the size of the $Li^+$ and $Na^+$ ions is too small for use in stuffing the large cavities of the cordierite structure. Furthermore, their adverse effect upon the electrical properties of the final glass-ceramic leads to their essential absence being preferred. Whereas the inclusion of nucleating agents conventionally employed in the production of glass-ceramic bodies, e.g., $SnO_2$, $TiO_2$, and $ZrO_2$, can be tolerated in small amounts, not only is their presence unnecessary but also it hazards the generation of crystal phases other than cordierite solid solution. Consequently, their essential absence is preferred.

Prior Art

The commercial production of glass-ceramic articles containing cordierite as the predominant crystal phase commenced in the late 1950's when Corning Glass Works, Corning, N.Y. introduced Code 9606 glass-ceramic nose cones for radomes. That glass-ceramic utilizes $TiO_2$ as a nucleating agent and has a composition approximating that of Example 15 of U.S. Pat. No. 2,920,971. That patent supplies several examples of $TiO_2$-nucleated, cordierite-containing glass-ceramics, none of which has a composition coming within the ranges of the present invention. Moreover, each of the glass-ceramics contained crystal phases other than cordierite. In contrast, the presence of cordierite solid solution as essentially the sole crystal phase in the instant inventive products is much preferred.

U.S. Pat. No. 3,450,546 discloses the preparation of transparent, sintered glass-ceramic articles containing α-cordierite as the principal crystal phase from glass compositions consisting essentially, by weight, of 12–18% MgO, 23–36% $Al_2O_3$, 48–60% $SiO_2$, and up to 5% total of at least one member of the group CaO, SrO, BaO, $LaO_2O_3$, PbO, $P_2O_5$, ZnO, and $B_2O_3$. The method of making comprised mixing frit of the composition with an organic binder, the mixture shaped into a body, the body fired at 500°–800° C. in an oxidizing atmosphere to burn out the binder, the body fired in a vacuum to a temperature where the viscosity of the glass was between $10^{6-10^8}$ poises to sinter the glass particles together, and thereafter firing the sintered body to 1200°–1425° C. to crystallize the glass in situ. Whereas there is literal overlap between the composition intervals recited in the patent and those operable in the instant invention, it is apparent that the compositions of the patent behaved differently from the present inventive glasses. For example, the compositions of the patent require crystallization temperatures of 1200°–1425° C., whereas the current inventive glasses crystallize in situ at temperatures of 850°–1000° C.. Hence, the patent evidences no recognition of the dramatic effect upon sintering temperature which substitutions of alkali metals and alkaline earth metals+aluminum for silicon, zinc+silicon for aluminum, zinc for magnesium, and boron for aluminum can exert. None of the working examples of the patent comes within the ranges required in the present invention. Hence, there was no coincidental or incidental discovery of compositions exhibiting properties desired in the present invention.

U.S. Pat. No. 4,221,047 is directed to a method for fabricating glass-ceramic multi-layer packages for integrated circuit devices. Two compositions, in weight percent, stated to be operable in the method are set out below:

| | | | |
|---|---|---|---|
| $SiO_2$ | 55.00 | $SiO_2$ | 52.5 |
| $Al_2O_3$ | 20.56 | $Al_2O_3$ | 21.0 |
| MgO | 20.00 | MgO | 21.5 |
| $AlPO_4$ | 3.44 | $P_2O_5$ | 2.0 |
| $B_2O_3$ | 1.00 | $B_2O_3$ | 1.0 |

Neither of those compositions comes within the ranges required in the instant invention.

U.S. Pat. No. 4,234,367 is also drawn to a method for making glass-ceramic multi-layer packages for integrated circuit devices. Compositions suitable for use in that method are stated to be included in the following ranges, in weight percent:

| | | | |
|---|---|---|---|
| $SiO_2$ | 50.6–52.5 | $SnO_2$ | 0–2 |
| $Al_2O_3$ | 21–22 | $P_2O_5$ | 0–2 |
| MgO | 22–24.2 | $ZrO_2$ | 0–2 |
| $B_2O_3$ | 0.5–2 | | |

Those ranges are outside of the composition intervals required in the present invention.

U.S. Pat. No. 4,301,324 defines two families of glass-ceramic compositions asserted to be operable as substrates for multi-layer, thick-film circuit patterns. One family consisted of bodies containing β-spodumene as the principal crystal phase; the other family consisted of bodies containing cordierite as the principal crystal phase with a secondary crystal phase of clinoenstatite. The cordierite-containing glass-ceramics consisted essentially, in weight percent, of:

| | | | |
|---|---|---|---|
| $SiO_2$ | 48–55 | $P_2O_5$ | 0–3 |
| $Al_2O_3$ | 18–23 | $TiO_2$ | 0–2.5 |
| MgO | 18–25 | $SnO_2$ | 0–2.5 |
| ZnO | 0–2 | $ZrO_2$ | 0–2.5 |
| $Li_2O$ | 0–1 | $TiO_2 + SnO_2 + ZrO_2$ | ≦5 |
| $B_2O_3$ | 0–3 | | |

The microstructure of the glass-ceramics of the patent is different from that present in the products of the instant invention in that the patented products contain a significant quantity of crystals of clinoenstatite, whereas the crystals of the products of the present invention consist essentially solely of cordierite. Hence, the compositions of the patent are outside those of the instant invention; none of the working examples provided in the patent has a composition coming within the ranges required in the present invention.

U.S. application Ser. No. 923,432, filed Dec. 27, 1986 in the names of Louis M. Holleran and Francis W. Martin under the title GLASS-CERAMICS SUITABLE FOR DIELECTRIC SUBSTRATES, now U.S. Pat. No. 4,714,687 describes glass-ceramic suitable for use as substrates in multi-layer packages for integrated circuits. Those glass-ceramics contain willemite ($2ZnO \cdot SiO_2$) as the predominant crystal phase and may contain a minor crystal phase of cordierite. Compositions therefor consist essentially, in weight percent, of:

| | | | | |
|---|---|---|---|---|
| $SiO_2$ | 30–55 | | PbO | 0–5 |
| $Al_2O_3$ | 10–30 | | CaO + SrO + BaO + PbO | 0–5 |
| ZnO | 15–45 | | $Cs_2O$ | 0–7 |
| $B_2O_3$ | 0–5 | | MgO | 0–15 |
| CaO | 0–5 | | MnO | 0–15 |
| SrO | 0–5 | | BaO | 0–5 |
| | | $B_2O_3$ + CaO + SrO + BaO + PbO + $Cs_2O$ + MgO + MnO | | 0–15 |

Whereas there is literal overlap between the above composition ranges and those of the present invention, the former compositions quite obviously provided products different from those resulting from the instant invention. Hence, glass-ceramics prepared from the prior compositions contained willemite as the predominant crystal phase; in contrast, cordierite constitutes essentially the sole crystal phase in the present glass-ceramics. None of the working examples comes within the composition intervals required in the present invention so there was no accidental or incidental discovery of glass-ceramics demonstrating the microstructure properties desired in the instant inventive products.

DESCRIPTION OF THE PREFERRED EMBODIMENTS

Table I reports a group of precursor, thermallycrystallizable glass compositions, expressed in terms of parts by weight on the oxide basis, which are illustrative of the glasses of the present invention. Because the sum of the individual components totals or closely approximates 100, for all practical purposes the tabulated values may be deemed to indicate weight percent. The actual batch ingredients may comprise any materials, either oxides or other compounds, which, when melted together, will be converted into the desired oxide in the proper proportions. For example, $BaCO_3$ may comprise the source of BaO.

The components for each of the exemplary compositions were compounded, ballmilled together to assist in securing a homogeneous melt, charged into platinum crucibles, and lids placed thereupon. The crucibles were moved into a furnace operating at about 1600° C. and the batches melted for about four to six hours. Portions of the melts were poured into steel molds to form glass slabs having dimensions of about $8'' \times 4'' \times 0.5''$ and those slabs were immediately transferred to an annealer operating at about 700° C. The casting of the melts into slabs allows inspection of glass quality. Furthermore, specimens can be cut from the slabs for use in testing for various physical properties of the glasses. In another procedure, the melts were poured as a thin stream into a bath of tap water, a practice termed "drigaging" in the glass art, and the resulting glass particles dried.

Whereas the following examples reflect laboratory work, it will be recognized that the compositions recorded in Table I can be batched, melted, and formed utilizing commercial, large scale glassmaking equipment and facilities. Also, although no fining agent, such as $As_2O_3$ and/or $Sb_2O_3$, was incorporated into the laboratory melts, the inclusion of a fining agent may be useful in obtaining optimum glass quality in commercial production.

TABLE I

| | 1 | 2 | 3 | 4 |
|---|---|---|---|---|
| $SiO_2$ | 53.0 | 49.9 | 43.7 | 47.8 |
| $Al_2O_3$ | 27.3 | 31.8 | 37.1 | 34.2 |
| MgO | 17.0 | 15.1 | 13.0 | 16.0 |
| ZnO | — | — | — | — |
| BaO | 2.42 | 3.2 | 6.2 | — |
| $K_2O$ | — | — | — | 2.0 |
| $B_2O_3$ | — | — | — | — |

| | 5 | 6 | 7 | 8 |
|---|---|---|---|---|
| $SiO_2$ | 46.0 | 52.0 | 49.1 | 47.0 |
| $Al_2O_3$ | 34.4 | 31.0 | 31.3 | 28.0 |
| MgO | 14.9 | 14.0 | 13.2 | 12.6 |
| ZnO | — | — | 3.3 | 6.4 |
| BaO | — | — | 3.1 | 6.0 |
| $K_2O$ | 4.7 | — | — | — |
| $B_2O_3$ | — | 3.0 | — | — |

| | 9 | 10 | 11 | 12 |
|---|---|---|---|---|
| $SiO_2$ | 45.8 | 51.0 | 47.9 | 44.9 |
| $Al_2O_3$ | 27.2 | 24.8 | 30.0 | 28.6 |
| MgO | 12.3 | 13.1 | 15.2 | 6.0 |
| ZnO | 6.2 | 6.6 | — | 15.2 |
| BaO | — | 6.6 | — | — |
| PbO | 8.5 | — | — | — |
| $K_2O$ | — | — | 4.0 | — |
| $Cs_2O$ | — | — | — | 5.3 |
| $B_2O_3$ | — | 1.4 | 2.9 | — |

| | 13 | 14 | 15 | 16 |
|---|---|---|---|---|
| $SiO_2$ | 45.1 | 41.9 | 43.5 | 43.8 |
| $Al_2O_3$ | 26.9 | 30.0 | 27.8 | 26.1 |
| MgO | 6.1 | 4.4 | 2.9 | 2.9 |
| ZnO | 15.3 | 18.0 | 20.7 | 20.8 |
| BaO | — | 5.6 | — | — |
| PbO | — | — | — | — |
| $K_2O$ | — | — | — | — |
| $Cs_2O$ | 5.3 | — | 5.1 | 5.1 |
| $B_2O_3$ | 1.3 | — | — | 1.3 |

Test samples were prepared by comminuting the glass slabs and the drigaged materials to frits wherein the mean particle diameters ranged between about 3–15 microns, mixing that frit with a minor amount of an organic binder/vehicle, pressing that mixture into button-shaped discs having a diameter of 0.5'' and a height of 0.25'', and then firing those discs at temperatures between about 950°–1000° C. for about two hours. All of the above compositions provided well-sintered, nonporous bodies. X-ray diffraction analyses of the crystallized discs provided patterns showing peaks typical of cordierite, but shifted slightly relative to stoichiometric cordierite, thereby indicating a solid solution of cordierite.

Table II reports specific heat treatment schedules applied to discs pressed in the manner described above, utilizing an electrically-heated furnace, along with modulus of rupture values (MOR) in terms of psi, linear coefficients of thermal expansion (Coef. Exp.) in terms of $\times 10^{-7}/°C$., dielectric constants (D.C.) at room temperature and 100 KHz, and dissipation factors (D.F.) at room temperature and 100 KHz, those measurements being made utilizing techniques conventional in the ceramic art. In the following schedules, after the expiration of the two-hour dwell period, the electric current to the furnace was cut off and the furnace allowed to cool with the discs retained therein. This "cooling at furnace rate" averaged about 200°–300° C./hour.

TABLE II

| Example | Heat Treatment | MOR | Coef. Exp. | D. C. | D. F. |
|---|---|---|---|---|---|
| 1 | 240° C./hour to 980° C. Hold for 2 hours | 12,000 | 52 | 6.0 | 0.0038 |
| 6 | 225° C./hour to 1000° C. Hold for 2 hours | 14,800 | 13 | 4.8 | 0.0013 |
| 8 | 300° C./hour to 965° C. Hold for 2 hours | 11,200 | 17 | 5.8 | 0.0005 |
| 10 | 300° C./hour to 955° C. Hold for 2 hours | 9,500 | 38 | 6.0 | 0.0001 |
| 11 | 300° C./hour to 965° C. Hold for 2 hours | 14,300 | 13 | 9.8 | 0.0694 |

As was explained earlier, multi-layer, inorganic integrated circuit packages are formed by laminating together, through sintering, a plurality of individual circuit plies, wherein each ply comprises a patterned, electrically conductive layer and through hole connectors, termed vias, bored in the ply for connecting the patterned electrically conductive layers of the respective plies to form a predetermined wiring circuit. Typically, the individual plies have been cut from tapes prepared from very finely-divided particles of inorganic material bonded together by means of an organic binder. Hence, the general practice for fabricating such packages has involved the following steps: (1) holes are punched in the tapes for the connectors; (2) the electrically conductive layers are screened onto the tape; (3) a predetermined number of tapes are laid up or laminated together with the vias in proper registry; and (4) the laminate is sintered together.

To simulate that practice, several of the above Examples in Table I were fabricated into tapes in accordance with the following procedure:

Drigaged glass particles were ballmilled for about 24 hours using $Al_2O_3$ balls to reduce the particles to diameters of less than 10 microns. That powder was thereafter mixed with an organic vehicle in a ballmill for 24 hours to yield a solids:organic vehicle weight ratio of 3:2. The organic vehicle comprised a binder (polyvinyl butyral), a solvent (toluene), and a surfactant (phosphate ester). The resultant slurry was continuously applied onto a polyester film at a thickness of about 0.005–0.02" using a doctor blade, and dried in air at about 25° C. to volatilize off the organic solvents. The so-formed tape was cut into sheets having dimensions of about 3×3" and 8–10 of those sheets stacked up. The stack was fired at 950° C. for two hours to sinter the sheets into an integral composite laminate having a thickness of about 0.06". That lamination firing also concurrently crystallized the glass powder in situ, thereby producing a glass-ceramic body operable as a substrate for integrated circuit packaging.

Table III lists several physical properties measured on the final laminates employing techniques conventional in the ceramic art. Density is reported in terms of g/cm³, modulus of rupture (MOR) in terms of psi, linear coefficient of thermal expansion (Coef. Exp.) in terms of $\times 10^{-7}/°C$., dielectric constant (D.C.) at room temperature and 100 KHz, and dissipation factor (D.F.) at room temperature and 100 KHz.

TABLE III

| Example | Density | MOR | Coef. Exp. | D. C. | D. F. |
|---|---|---|---|---|---|
| 1 | — | 19,300 | 48 | 5.7 | 0.002 |
| 9 | 2.82 | 24.800 | 19 | 5.8 | 0.0079 |
| 10 | 2.71 | 22,800 | 30 | 5.4 | 0.0013 |

Powders of the inventive compositions can be sintered together into an integral body and concurrently crystallized in situ very rapidly; that is, exposure periods no longer than about 10–15 minutes at temperatures between about 850°–1000° C. are sufficient, with the entire firing cycle from room temperature (R.T.≈25° C.) through passage through the crystallization temperature interval and return to room temperature requiring no more than about one hour. This fast crystallization capability is especially desirable in the fabrication of integrated circuit packages because it permits crystallization to be secured utilizing a heat treating schedule which is equally useful with thick film inks of the type employed in the commercial manufacture of thick-film hybrid circuits.

Where the number of laminae of tape exceeds four and/or the firing of the laminate will be carried out in an essentially non-oxidizing atmosphere, e.g., nitrogen, or in a reducing atmosphere, e.g., hydrogen, the laminate may, desirably, be initially subjected to a temperature somewhat above 250° C. for a period of time sufficient to insure substantially complete removal of the organic constituents prior the crystallization firing procedure.

Table IV recites physical properties measured on Example 9 of Table I which had been fabricated into tapes in accordance with the description above, the tapes stacked, and the stacks then placed on a lehr and subjected to the following heat treatment schedule:

R.T.-800° C. at about 60° C./minute
800°–925° C. for about 15 minutes
925°–800° C. for about 25° C./minute
800° -R.T. at about 70° C./minute The total time from the introduction of the specimens into the lehr to removal of the specimens from the lehr was somewhat less than about one hour.

In like manner to Table III, Table IV records density in terms of g/cm³, modulus of rupture (MOR) in terms of psi, linear coefficient of thermal expansion (Coef. Exp.) in terms of $\times 10^{-7}/°C$., dielectric constant (D.C.) at room temperature and 100 KHz, and dissipation factor (D.F.) at room temperature and 100 KHz.

TABLE IV

| Example | Density | MOR | Coef. Exp. | D. C. | D. F. |
|---|---|---|---|---|---|
| 9 | 2.83 | 19,600 | 16 | 5.5 | 0.0052 |

A comparison of the property values reported in Tables III and IV clearly reveals the relatively broad ranges that are possible within the narrow composition intervals of the present invention. Hence, by careful control of base composition and heat treatment, the physical properties of the inventive compositions can be rather exactly tailored.

The above description illustrates that, by careful control of base composition and heat treatment parameters, the physical properties of the inventive glass-ceramics can be rather exactly tailored. Example 10 is our most preferred composition.

We claim:

1. A multi-layer, inorganic integrated circuit package consisting of a plurality of individual circuit plies, wherein each ply comprises a substrate with a patterned, electrically conductive layer applied thereto with through hole connectors in each ply for connecting the patterned electrically conductive layers of the respective plies to form a wiring circuit, the substrate for said plies consisting of a non-porous glass-ceramic material exhibiting a dielectric constant less than about 6, a linear coefficient of thermal expansion between about $12-60 \times 10^{-7}/°C.$, and containing cordierite solid solution as essentially the sole crystal phase, said glass-ceramic being crystallizable in situ at a temperature between 850°–1000° C. from a glass material having a composition essentially free from a nucleating agent, $Li_2O$, and $Na_2O$ and consisting essentially, expressed in terms of weight percent on the oxide basis of 10–25% MgO+ZnO, consisting of 2–18% MgO and 0–21% ZnO, 20–38% $Al_2O_3$, 40–52% $SiO_2$, and 2–15% total of at least one oxide in the indicated proportion selected from the group consisting of up to 10% of a divalent metal oxide selected from the group consisting of CaO, SrO, BaO, and PbO, and up to 5% $B_2O_3$.

2. A package according to claim 1 wherein said glass-ceramic material of said substrate contains >16–25% MgO+ZnO, 20–35% $Al_2O_3$, and, where present, up to 5% BaO.

* * * * *